(12) United States Patent
Mori et al.

(10) Patent No.: US 12,076,820 B2
(45) Date of Patent: Sep. 3, 2024

(54) SUBSTRATE PROCESSING APPARATUS AND SUBSTRATE PROCESSING METHOD

(71) Applicant: Tokyo Electron Limited, Tokyo (JP)

(72) Inventors: Hirotoshi Mori, Kumamoto (JP); Hayato Tanoue, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 666 days.

(21) Appl. No.: 17/413,599

(22) PCT Filed: Dec. 9, 2019

(86) PCT No.: PCT/JP2019/048093
§ 371 (c)(1),
(2) Date: Jun. 14, 2021

(87) PCT Pub. No.: WO2020/129734
PCT Pub. Date: Jun. 25, 2020

(65) Prior Publication Data
US 2022/0040799 A1  Feb. 10, 2022

(30) Foreign Application Priority Data

Dec. 21, 2018 (JP) .................................. 2018-240189

(51) Int. Cl.
*B23K 26/53* (2014.01)
*B23K 26/03* (2006.01)
(Continued)

(52) U.S. Cl.
CPC .............. *B23K 26/53* (2015.10); *B23K 26/03* (2013.01); *B23K 26/0604* (2013.01);
(Continued)

(58) Field of Classification Search
CPC .... B23K 26/53; B23K 26/03; B23K 26/0604; B23K 26/083; B23K 26/0876;
(Continued)

(56) References Cited

U.S. PATENT DOCUMENTS

| 2007/0072393 A1* | 3/2007 | Aspar | H01L 21/76254 |
| | | | 438/459 |
| 2008/0044984 A1* | 2/2008 | Hsieh | H01L 27/14618 |
| | | | 438/459 |

(Continued)

FOREIGN PATENT DOCUMENTS

| CN | 101131921 A | 2/2008 |
| JP | H9-216152 A | 8/1997 |

(Continued)

OTHER PUBLICATIONS

International Search Report of PCT/JP2019/048093 dated Jan. 28, 2020.

(Continued)

*Primary Examiner* — Caleb E Henry
(74) *Attorney, Agent, or Firm* — Shih IP Law Group, PLLC.

(57) ABSTRACT

A substrate processing apparatus includes a holder configured to hold a combined substrate; a peripheral modifying device configured to form a peripheral modification layer to an inside of a first substrate along a boundary between a peripheral portion and a central portion; an internal modifying device configured to form an internal modification layer to the inside of the first substrate along a plane direction; a holder moving mechanism configured to move the holder in a horizontal direction. The peripheral modifying device radiates laser light for periphery to the inside of the first substrate while moving the holder to perform eccentricity correction. The internal modifying device radiates laser light for internal surface without performing the eccentricity correction at least at a center portion of the inside of the first substrate.

14 Claims, 18 Drawing Sheets

(51) Int. Cl.
  *B23K 26/06* (2014.01)
  *B23K 26/08* (2014.01)
  *B23K 103/00* (2006.01)
  *H01L 21/67* (2006.01)
(52) U.S. Cl.
  CPC ...... B23K 26/083 (2013.01); *H01L 21/67092* (2013.01); *B23K 26/0876* (2013.01); *B23K 2103/56* (2018.08)
(58) Field of Classification Search
  CPC .......... B23K 2103/56; H01L 21/67092; H01L 21/67259; H01L 21/304; H01L 21/681; H01L 21/68764
  See application file for complete search history.

(56) References Cited

U.S. PATENT DOCUMENTS

| | | | | |
|---|---|---|---|---|
| 2008/0238957 | A1* | 10/2008 | Hayashi | B41J 2/17509 347/85 |
| 2008/0239029 | A1* | 10/2008 | Hayashi | B41J 2/145 347/3 |
| 2008/0297550 | A1* | 12/2008 | Igarashi | B41J 2/2132 347/12 |
| 2009/0033700 | A1* | 2/2009 | Kusumoto | B41J 2/175 347/12 |
| 2009/0042363 | A1* | 2/2009 | Miyazaki | H01L 21/76256 438/459 |
| 2009/0058915 | A1* | 3/2009 | Hayashi | B41J 2/175 347/17 |
| 2009/0058925 | A1* | 3/2009 | Hayashi | B41J 2/16532 347/30 |
| 2015/0140785 | A1 | 5/2015 | Kwak | |
| 2016/0064229 | A1* | 3/2016 | Kim | B28D 5/0011 225/2 |
| 2018/0233707 | A1* | 8/2018 | Mine | H01L 21/67173 |

FOREIGN PATENT DOCUMENTS

| | | |
|---|---|---|
| JP | 2004-111606 A | 4/2004 |
| JP | 2006-108532 A | 4/2006 |
| JP | 2009-131942 A | 6/2009 |
| JP | 2009-135342 A | 6/2009 |
| JP | 2011-159798 A | 8/2011 |
| JP | 2012-064667 A | 3/2012 |
| JP | 2012-069736 A | 4/2012 |
| JP | 2014-167966 A | 9/2014 |
| JP | 2015-516672 A | 6/2015 |
| JP | 2016-215231 A | 12/2016 |
| JP | 2017-024039 A | 2/2017 |
| JP | 2017-071074 A | 4/2017 |
| JP | 2017-191825 A | 10/2017 |
| JP | 2018-043340 A | 3/2018 |
| WO | 2013126927 A2 | 8/2013 |

OTHER PUBLICATIONS

International Search Report of PCT/JP2019/028310 dated Oct. 8, 2019.

* cited by examiner

FIG. 15A  FIG. 15B  FIG. 15C
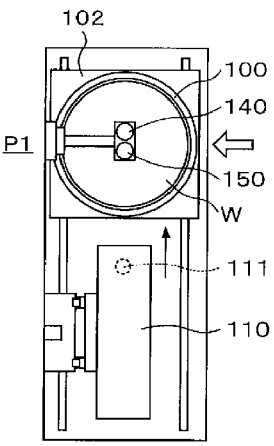
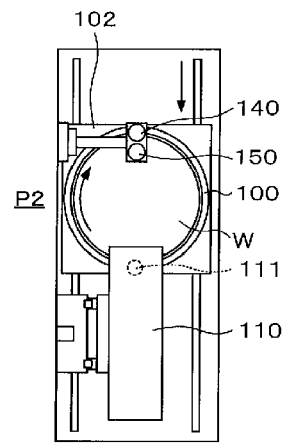
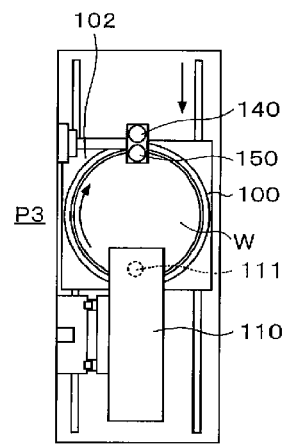
FIG. 15D  FIG. 15E
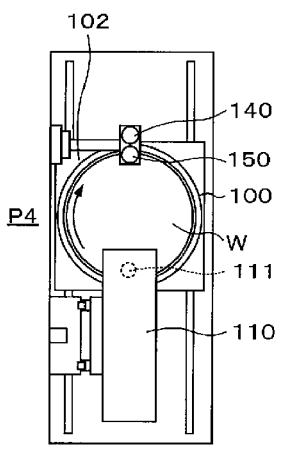
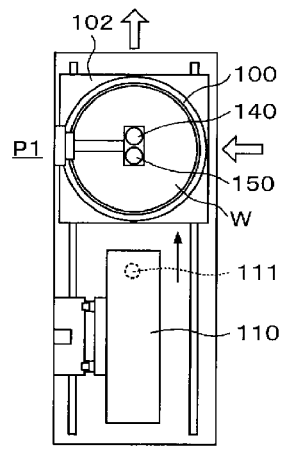

SUBSTRATE PROCESSING APPARATUS AND SUBSTRATE PROCESSING METHOD

CROSS-REFERENCE TO RELATED APPLICATIONS

This Application is a U.S. national phase application under 35 U.S.C. § 371 of PCT Application No. PCT/JP2019/048093 filed on Dec. 9, 2019, which claims the benefit of Japanese Patent Application No. 2018-240189 filed on Dec. 21, 2018, the entire disclosures of which are incorporated herein by reference.

TECHNICAL FIELD

The various aspects and embodiments described herein pertain generally to a substrate processing apparatus and a substrate processing method.

BACKGROUND

Patent Document 1 discloses a manufacturing method for a stacked semiconductor device. In this manufacturing method, the stacked semiconductor device is produced by stacking two or more semiconductor wafers. At this time, after each semiconductor wafer is stacked on another semiconductor wafer, a rear surface of the semiconductor wafer is ground so that it has a required thickness.

It is described in Patent Document 2 that a circular plate-shaped grinding tool having abrasive grains at a peripheral portion thereof is rotated and at least an outer peripheral surface of the grinding tool is brought into linear contact with a semiconductor wafer to grind a circumferential end of the semiconductor wafer into a substantially L-shape. The semiconductor wafer is produced by bonding two sheets of silicon wafers.

PRIOR ART DOCUMENT

Patent Document 1: Japanese Patent Laid-open Publication No. 2012-069736
Patent Document 2: Japanese Patent Laid-open Publication No. H09-216152

DISCLOSURE OF THE INVENTION

Means for Solving the Problems

In an exemplary embodiment, a substrate processing apparatus configured to process a substrate includes a holder configured to hold, in a combined substrate in which a first substrate and a second substrate are bonded to each other, the second substrate; a detector configured to detect a boundary between a bonding region where the first substrate and the second substrate are bonded and a non-bonding region located at an outside of the bonding region; a peripheral modifying device configured to form a peripheral modification layer by radiating laser light for periphery to an inside of the first substrate held by the holder along a boundary between a peripheral portion of the first substrate as a removing target and a central portion thereof; an internal modifying device configured to form an internal modification layer by radiating laser light for internal surface to the inside of the first substrate held by the holder along a plane direction of the first substrate; a holder moving mechanism configured to move the holder in a horizontal direction; and a controller configured to calculate an eccentric amount between a center of the holder and a center of the bonding region from a detection result obtained by the detector, and perform eccentricity correction of moving the holder by controlling the holder moving mechanism such that the center of the holder and the center of the bonding region are coincident with each other based on the eccentric amount. The peripheral modifying device radiates the laser light for periphery to the inside of the first substrate while moving the holder to perform the eccentricity correction. The internal modifying device radiates the laser light for internal surface without performing the eccentricity correction at least at a center portion of the inside of the first substrate.

BRIEF DESCRIPTION OF THE DRAWINGS

FIG. 15A to FIG. 15E are explanatory diagrams illustrating main processes of a modifying processing.

DETAILED DESCRIPTION

Figure 1:
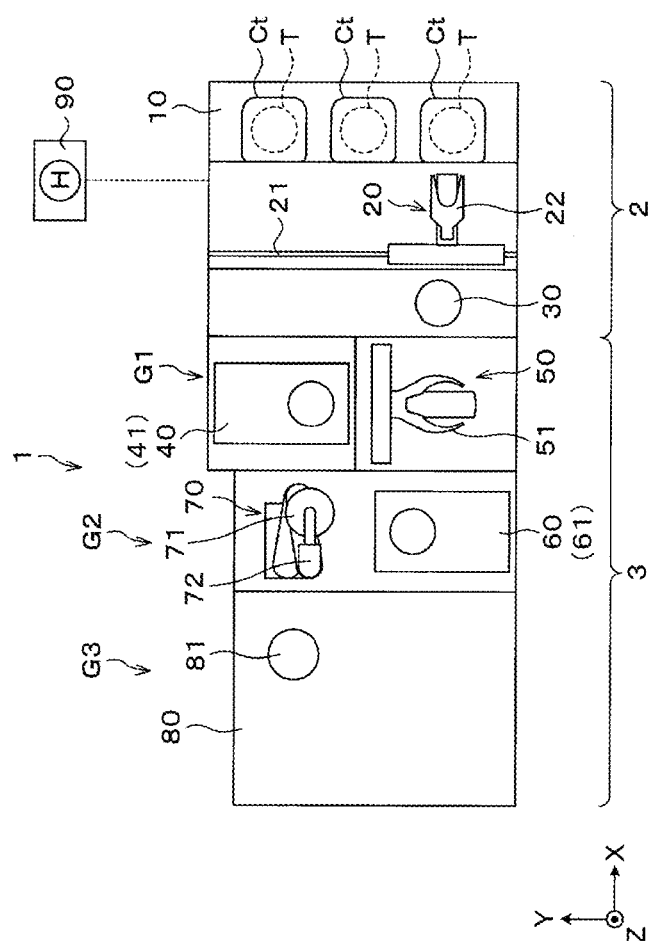
FIG. 1 is a plan view illustrating a configuration of a wafer processing system according to an exemplary embodiment.

In a manufacturing process for a semiconductor device, a semiconductor wafer having, for example, a plurality of devices such as electronic circuits on a front surface thereof is thinned by grinding a rear surface of the wafer, as described in Patent Document 1, for example.

The grinding of the rear surface of the wafer is performed by rotating the wafer and a grinding whetstone and lowering the grinding whetstone in a state that the grinding whetstone is in contact with the rear surface of the wafer, for example. In this case, since the grinding whetstone is worn away, it needs to be replaced regularly. Further, since grinding water is used in the grinding processing, disposal of a waste liquid is also required. As a result, a running cost is increased in the conventional wafer thinning processing.

Typically, a peripheral portion of the wafer is chamfered. If, however, the grinding processing is performed on the rear surface of the wafer as stated above, the peripheral portion of the wafer is given a sharp pointed shape (a so-called knife edge shape). If so, chipping takes place at the peripheral portion of the wafer, and the wafer may be damaged. Thus, there is performed a so-called edge trimming of removing the peripheral portion of the wafer prior to the grinding processing.

The end surface grinding apparatus described in the aforementioned Patent Document 2 is an apparatus configured to perform this edge trimming. In this end surface grinding apparatus, however, since the edge trimming is performed by the grinding, a whetstone is worn away and needs to be replaced regularly. Further, since a large amount of the grinding water is used, the disposal of the waste liquid is required. For these reasons, the running cost is increased in the conventional edge trimming.

To carry out the thinning and the edge trimming efficiently, the present disclosure provides a technique capable of performing pre-treatments therefor efficiently. Hereinafter, a wafer processing system as a substrate processing apparatus and a wafer processing method as a substrate processing method according to an exemplary embodiment will be described with reference to the accompanying drawings. Further, in the present specification and the drawings, parts having substantially same functional configurations will be assigned same reference numerals, and redundant description thereof will be omitted.

First, a configuration of the wafer processing system according to the present exemplary embodiment will be described. FIG. 1 is a plan view illustrating a schematic configuration of a wafer processing system 1.

Figure 2:
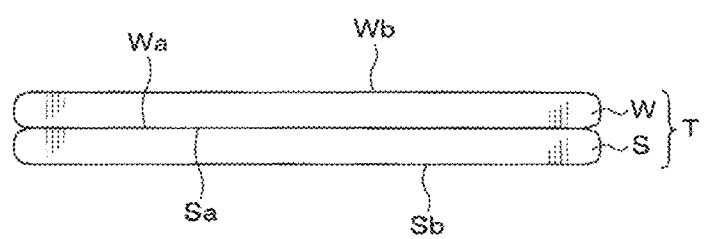
FIG. 2 is a side view illustrating a schematic structure of a combined wafer.
Figure 3:
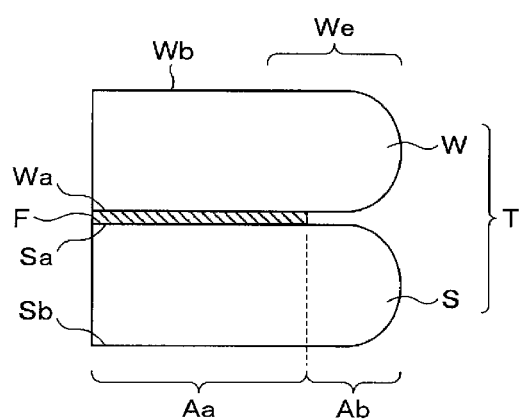
FIG. 3 is a side view illustrating a schematic structure of a part of the combined wafer.

The wafer processing system 1 performs a required processing on a combined wafer T as a combined substrate in which a processing target wafer W as a first substrate and a support wafer S as a second substrate are bonded to each other, as illustrated in FIG. 2 and FIG. 3. In the wafer processing system 1, a peripheral portion We of the processing target wafer W is removed, and the processing target wafer W is thinned. Hereinafter, in the processing target wafer W, a surface bonded to the support wafer S will be referred to as "front surface Wa," and a surface opposite to the front surface Wa will be referred to as "rear surface Wb." Likewise, in the support wafer S, a surface bonded to the processing target wafer W will be referred to as "front surface Sa," and a surface opposite to the front surface Sa will be referred to as "rear surface Sb".

The processing target wafer W is a semiconductor wafer such as, but not limited to, a silicon wafer, and has, on the front surface Wa thereof, a device layer (not shown) including a plurality of devices. Further, an oxide film F, for example, a $SiO_2$ film (TEOS film) is further formed on the device layer. The peripheral portion We of the processing target wafer W is chamfered, and a thickness of the peripheral portion We decreases toward a leading end thereof on a cross section thereof. Here, the peripheral portion We is a portion to be removed by edge trimming and ranges from, e.g., 1 mm to 5 mm from an edge of the processing target wafer W in a diametrical direction thereof.

In FIG. 2, for the sake of simplicity of illustration, illustration of the oxide film F is omitted. In the other drawings recited in the following description, illustration of the oxide film F may sometimes be omitted as well.

The support wafer S is a wafer configured to support the processing target wafer W, and is, for example, a silicon wafer. An oxide film (not shown) is formed on the surface Sa of the support wafer S. Further, the support wafer S serves as a protection member which protects the devices on the front surface Wa of the processing target wafer W. Further, if the support wafer S has a plurality of devices on the front surface Sa thereof, a device layer (not shown) is formed on the front surface Sa, the same as in the processing target wafer W.

Here, if the processing target wafer W and the support wafer S are bonded at the peripheral portion We of the processing target wafer W, the peripheral portion We may not be removed appropriately. For the reason, at an interface between the processing target wafer W and the support wafer S, a bonding region Aa where the oxide film F and the front surface Sa of the support wafer S are bonded and a non-bonding region Ab are formed. The non-bonding region Ab is located at an outside of the bonding region Aa in the diametrical direction. Since this non-bonding region Ab is provided, the peripheral portion We can be appropriately removed. Further, it is desirable that an outer end portion of the bonding region Aa is located slightly outer than an inner end portion of the peripheral portion We to be removed in the diametrical direction, as will be described in detail.

As depicted in FIG. 1, the wafer processing system 1 includes a carry-in/out station 2 and a processing station 3 connected as one body. In the carry-in/out station 2, a cassette Ct capable of accommodating therein a multiple number of combined wafers T is carried to/from the outside, for example. The processing station 3 is equipped with various kinds of processing apparatuses configured to perform required processings on the combined wafers T.

A cassette placing table 10 is provided in the carry-in/out station 2. In the shown example, a plurality of, for example, three cassettes Ct can be arranged on the cassette placing table 10 in a row in the Y-axis direction. Further, the number of the cassettes Ct placed on the cassette placing table 10 is not limited to the example of the present exemplary embodiment but can be selected as required.

In the carry-in/out station 2, a wafer transfer device 20 is provided adjacent to the cassette placing table 10 at a negative X-axis side of the cassette placing table 10. The wafer transfer device 20 is configured to be movable on a transfer path 21 which is elongated in the Y-axis direction. Further, the wafer transfer device 20 is equipped with, for example, two transfer arms 22 each of which is configured to hold and transfer the combined wafer T. Each transfer arm 22 is configured to be movable in a horizontal direction and a vertical direction and pivotable around a horizontal axis and a vertical axis. Further, the configuration of the transfer arm 22 is not limited to the exemplary embodiment, and various other configurations may be adopted. The wafer transfer device 20 is configured to be capable of transferring the combined wafer T to/from the cassette Ct of the cassette placing table 10 and a transition device 30 to be described later.

In the carry-in/out station 2, the transition device 30 configured to deliver the combined wafer T is provided adjacent to the wafer transfer device 20 at a negative X-axis side of the wafer transfer device 20.

The processing station 3 is provided with, for example, three processing blocks G1 to G3. The first processing block G1, the second processing block G2 and the third processing block G3 are arranged side by side in this sequence from a positive X-axis side (from a carry-in/out station 2 side) toward a negative X-axis side.

The first processing block G1 is equipped with an etching apparatus 40, a cleaning apparatus 41 and a wafer transfer device 50. The etching apparatus 40 and the cleaning apparatus 41 are stacked on top of each other. Further, the number and the layout of the etching apparatus 40 and the cleaning apparatus 41 are not limited to the shown example. By way of example, the etching apparatus 40 and the cleaning apparatus 41 may be elongated in the X-axis direction and arranged side by side when viewed from the top. Further, a plurality of etching apparatuses 40 and a plurality of cleaning apparatuses 41 may be respectively stacked on top of each other.

The etching apparatus 40 is configured to etch the rear surface Wb of the processing target wafer W grounded by a processing apparatus 80 to be described later. By way of example, by supplying a chemical liquid (etching liquid) onto the rear surface Wb, the rear surface Wb is wet-etched. For instance, HF, $HNO_3$, $H_3PO_4$, TMAH, Choline, KOH, or the like may be used.

The cleaning apparatus 41 is configured to clean the rear surface Wb of the processing target wafer W grounded by the processing apparatus 80 to be described later. By way of example, by bringing a brush into contact with the rear surface Wb, the rear surface Wb is cleaned by being scrubbed. Furthermore, a pressurized cleaning liquid may be used for the cleaning of the rear surface Wb. In addition, the cleaning apparatus 41 may be configured to clean the rear surface Sb of the support wafer S as well as the rear surface Wb of the processing target wafer W.

The wafer transfer device 50 is disposed at, for example, a negative Y-axis side of the etching apparatus 40 and the cleaning apparatus 41. The wafer transfer device 50 has, for example, two transfer arms 51 each of which is configured to hold and transfer the combined wafer T. Each transfer arm 51 is configured to be movable in a horizontal direction and a vertical direction and pivotable around a horizontal axis and a vertical axis. Further, the configuration of the transfer arm 51 is not limited to the exemplary embodiment, and various other configurations may be adopted. Additionally, the wafer transfer device 50 is configured to be capable of transferring the combined wafer T to/from the transition device 30, the etching apparatus 40, the cleaning apparatus 41 and a modifying apparatus 60 to be described later.

The second processing block G2 is equipped with the modifying apparatus 60, a periphery removing apparatus 61 and a wafer transfer device 70. The modifying apparatus 60 and the periphery removing apparatus 61 are stacked on top of each other. Further, the number and the layout of the modifying apparatus 60 and the periphery removing apparatus 61 is not limited to the example of the present exemplary embodiment.

The modifying apparatus 60 is configured to form a peripheral modification layer, a split modification layer and an internal modification layer by radiating laser light to an inside of the processing target wafer W. A specific configuration of the modifying apparatus 60 will be elaborated later.

The periphery removing apparatus 61 is configured to remove the peripheral portion We of the processing target wafer W, starting from the peripheral modification layer formed by the modifying apparatus 60. A specific configuration of the periphery removing apparatus 61 will be elaborated later.

The wafer transfer device 70 is disposed at, for example, a positive Y-axis side of the modifying apparatus 60 and the periphery removing apparatus 61. The wafer transfer device 70 is equipped with, for example, two transfer arms 71 each of which is configured to hold and transfer the combined wafer T. Each transfer arm 71 is supported at a multi-joint arm member 72 and configured to be movable in a horizontal direction and a vertical direction and pivotable around a horizontal axis and a vertical axis. A specific configuration of the transfer arm 71 will be elaborated later. The wafer transfer device 70 is configured to be capable of transferring the combined wafer T to/from the cleaning apparatus 41, the modifying apparatus 60, the periphery removing apparatus 61 and the processing apparatus 80 to be described later.

The third processing block G3 is equipped with the processing apparatus 80. The number and the layout of the processing apparatus 80 is not limited to the example of the present exemplary embodiment, and a plurality of processing apparatuses 80 may be arranged as required.

The processing apparatus 80 is configured to grind the rear surface Wb of the processing target wafer W. Further, the processing apparatus 80 is configured to remove, in the rear surface Wb having the internal modification layer formed therein, the corresponding internal modification layer, and also removes the peripheral modification layer. To be specific, the processing apparatus 80 grinds the rear surface Wb by rotating the processing target wafer W and a grinding whetstone (not shown) in the state that the rear surface Wb of the processing target wafer W held by the chuck 81 is in contact with the grinding whetstone. Further, a commonly known grinding apparatus (polishing apparatus) is used as the processing apparatus 80. For example, an apparatus described in Japanese Patent Laid-open Publication No. 2010-069601 may be used.

The above-described wafer processing system 1 is equipped with a control device 90 as a controller. The control device 90 is implemented by, for example, a computer, and includes a program storage (not shown). A program for controlling a processing of the combined wafer T in the wafer processing system 1 is stored in the program storage. Further, the program storage also stores therein a program for implementing a substrate processing to be described later in the wafer processing system 1 by controlling the above-described various processing apparatuses and a driving system such as the transfer devices. Further, the programs may be recorded in a computer-readable recording medium H, and may be installed from this recording medium H to the control device 90.

Figure 4:
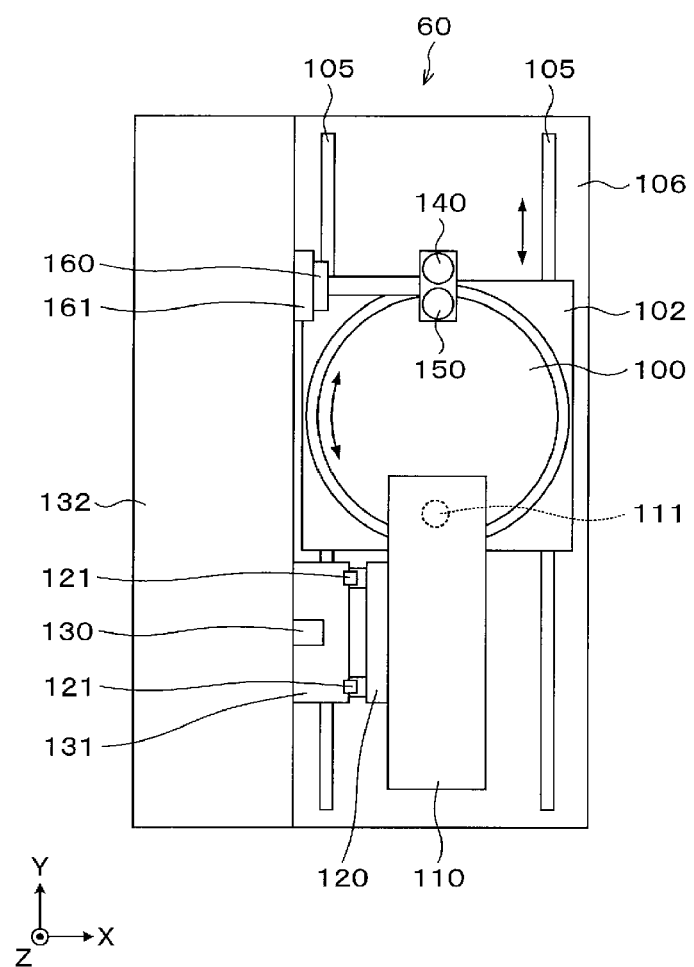
FIG. 4 is a plan view illustrating a schematic configuration of a modifying apparatus.
Figure 5:
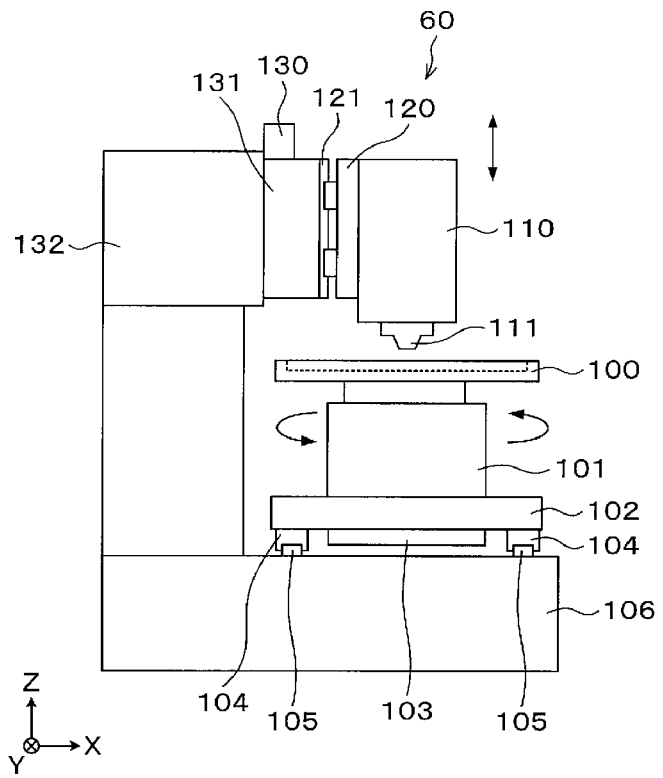
FIG. 5 is a side view illustrating the schematic configuration of the modifying apparatus.

Now, the aforementioned modifying apparatus 60 will be described. FIG. 4 is a plan view illustrating a schematic configuration of the modifying apparatus 60. FIG. 5 is a side view illustrating the schematic configuration of the modifying apparatus 60.

The modifying apparatus 60 is equipped with a chuck 100 as a holder configured to hold the combined wafer W on a top surface thereof. The chuck 100 is configured to attract and hold the support wafer S in the state that the processing target wafer W is placed at an upper side and the support wafer S is placed at a lower side. The chuck 100 is supported on a slider table 102 with an air bearing 101 therebetween. A rotator 103 is provided at a bottom surface side of the slider table 102. The rotator 103 incorporates therein, for example, a motor as a driving source. The chuck 100 is configured to be rotated around a vertical axis by the rotator 103 via the air bearing 101 therebetween. The slider table 102 is configured to be moved by a horizontally moving member 104, which is provided at a bottom surface side thereof, along a rail 105 which is provided on a base 106 and elongated in the Y-axis direction. Further, in the present exemplary embodiment, the rotator 103 and the horizontally moving member 104 constitute a holder moving mechanism. Further, though not particularly limited, a driving source of the horizontally moving member 104 may be, for example, a linear motor.

A laser head 110 is provided above the chuck 100. The laser head 110 has a lens 111. The lens 111 is a cylindrical member provided on a bottom surface of the laser head 110, and is configured to radiate the laser light to the processing target wafer W held by the chuck 100. In the present exemplary embodiment, the laser head 110 is shared by a peripheral modifying device and an internal modifying device.

The laser head 110 is further equipped with a non-illustrated LCOS (Liquid Crystal on Silicon). The LCOS serves as a spatial light modulator, and is configured to output the laser light after modulating it. To be specific, the LCOS is capable of controlling a focal position and a phase of the laser light, and thus capable of adjusting a shape and a number (a split number) of the laser light radiated to the processing target wafer W.

Further, the laser head 110 is configured to concentrate and radiate the laser light having a wavelength featuring transmissivity for the processing target wafer W to a required position within the processing target wafer W as high-frequency laser light in a pulse shape oscillated from a laser light oscillator (not shown). Accordingly, a portion within the processing target wafer W to which the laser light is concentrated is modified, so that a peripheral modification layer, a split modification layer and an internal modification layer are formed.

The laser head 110 is supported at a supporting member 120. The laser head 110 is configured to be moved up and down by an elevating mechanism 130 along a vertically elongated rail 121. Further, the laser head 110 is configured to be moved in the Y-axis direction by a moving mechanism 131. Each of the elevating mechanism 130 and the moving mechanism 131 is supported at a supporting column 132.

Above the chuck 100, a macro-camera 140 and a micro-camera 150 as a detector are provided at a positive Y-axis side of the laser head 110. For example, the macro-camera 140 and the micro-camera 150 are formed as one body, and the macro-camera 140 is provided at a positive Y-axis side of the micro-camera 150. The macro-camera 140 and the micro-camera 150 are configured to be moved up and down by an elevating mechanism 160, and also configured to be moved in the Y-axis direction by a moving mechanism 161.

Figure 6:
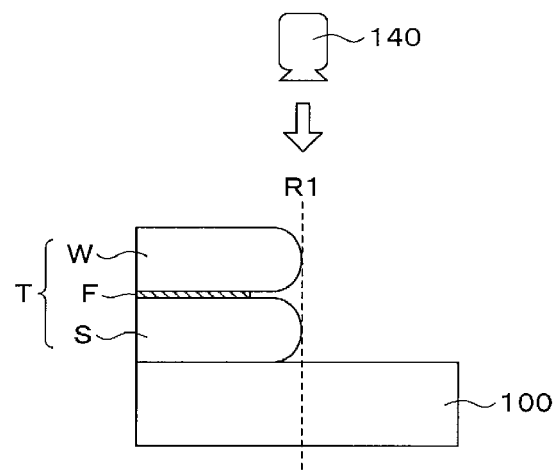
FIG. 6 is an explanatory diagram illustrating a portion an image of which is taken by a macro-camera.

As depicted in FIG. 6, the macro-camera 140 is configured to image (detect) an outer end portion R1 (indicated by a dashed line in FIG. 6) of the processing target wafer W (combined wafer T). The macro-camera 140 is equipped with, for example, a coaxial lens, and radiates visible light, for example, red light and receives reflection light from a target object. Although the visible light is reflected on the rear surface Wb of the processing target wafer W, it is absorbed into the chuck 100. For the reason, in the image obtained by the macro-camera 140, the processing target wafer W is seen white, whereas the chuck 100 is seen black. For example, the macro-camera 140 has an image magnification of two times.

Figure 7:
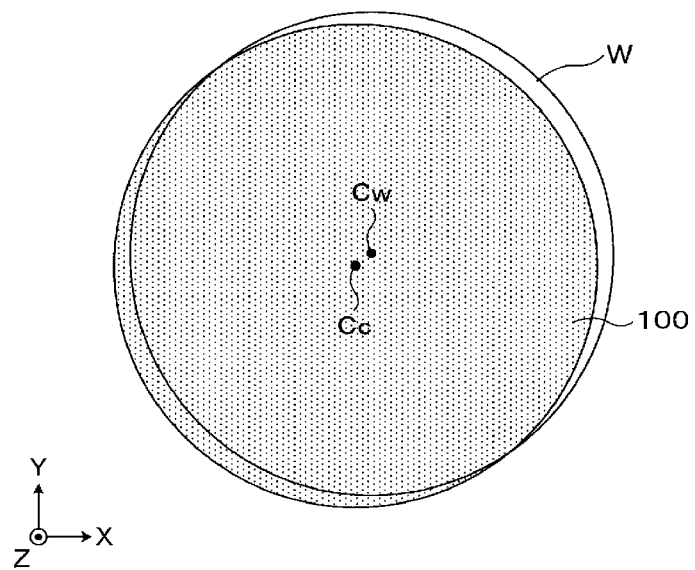
FIG. 7 is an explanatory diagram illustrating a first eccentric amount calculated from macro-alignment.

The image obtained by the macro-camera 140 is outputted to the control device 90. In the control device 90, a first eccentric amount between a center Cc of the chuck 100 and a center Cw of the processing target wafer W, as illustrated in FIG. 7, is calculated from the image obtained by the macro-camera 140.

Figure 8:
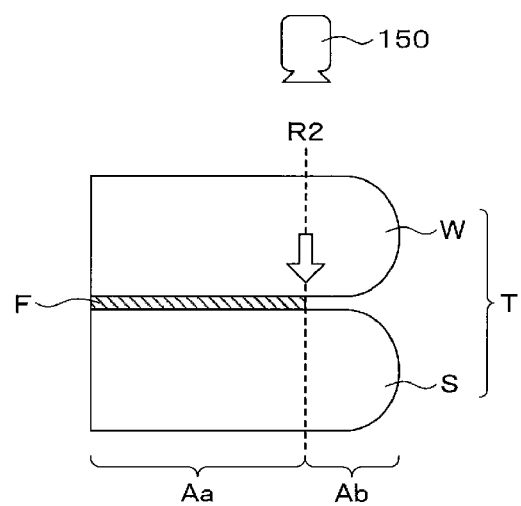
FIG. 8 is an explanatory diagram illustrating a portion an image of which is taken by a micro-camera.

The micro-camera 150 is configured to image a peripheral portion of the processing target wafer W and image (detect) a boundary R2 (indicated by a dashed line in FIG. 8) between the bonding region Aa and the non-bonding region Ab, as illustrated in FIG. 8. The micro-camera 150 is equipped with, for example, a coaxial lens, and radiates infrared light (IR light) and receives reflection light from a target object. By way of example, the micro-camera 150 has an image magnification of 10 times. A field of view of the micro-camera 150 is about ⅕ of a field of view of the macro-camera 140, and a pixel size of the micro-camera 150 is about ⅕ of a pixel size of the macro-camera 140.

Figure 9:
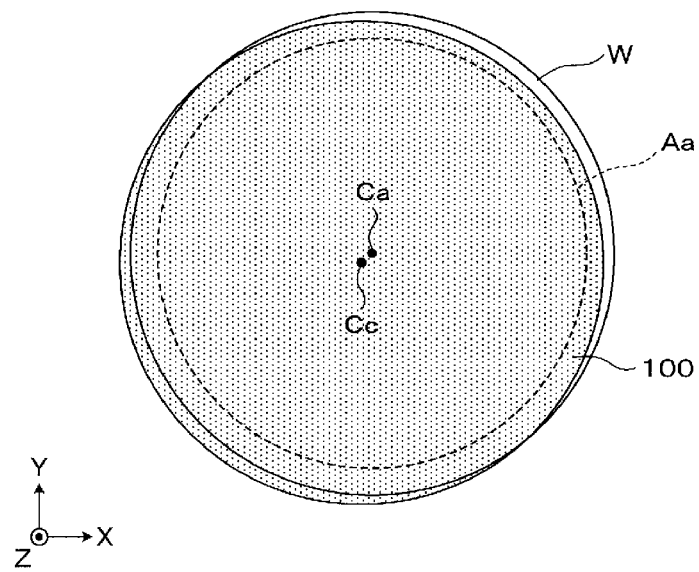
FIG. 9 is an explanatory diagram illustrating a second eccentric amount calculated from micro-alignment.

The image obtained by the micro-camera 150 is outputted to the control device 90. In the control device 90, a second eccentric amount between the center Cc of the chuck 100 and a center Ca of the bonding region Aa, as shown in FIG. 9, is calculated from the image obtained by the micro-camera 150. Based on the second eccentric amount, the control device 90 controls the holder moving mechanism (the rotator 103 and the horizontally moving member 104) to move the chuck 100 such that the center of the chuck 100 and the center of the bonding region Aa are coincident with each other. In the following description, this control of moving the chuck 100 may be referred to as "eccentricity correction".

Figure 10:
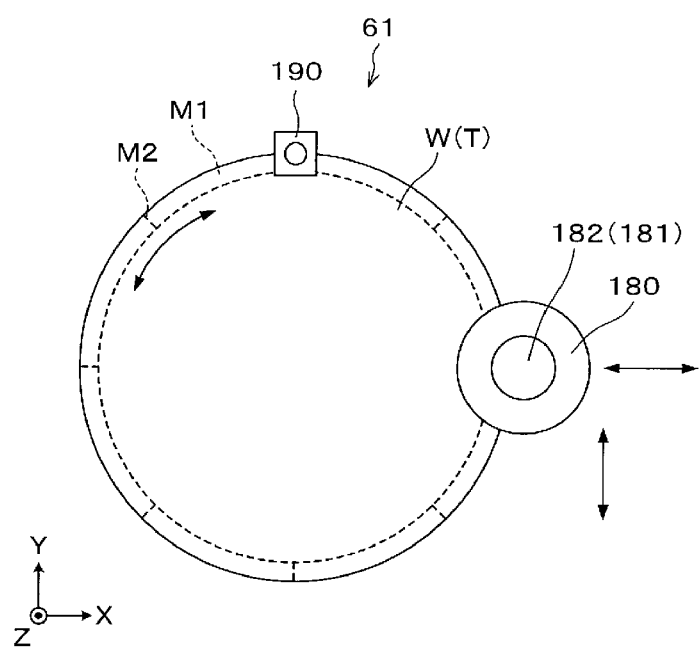
FIG. 10 is a plan view illustrating a schematic configuration of a periphery removing apparatus.
Figure 11:
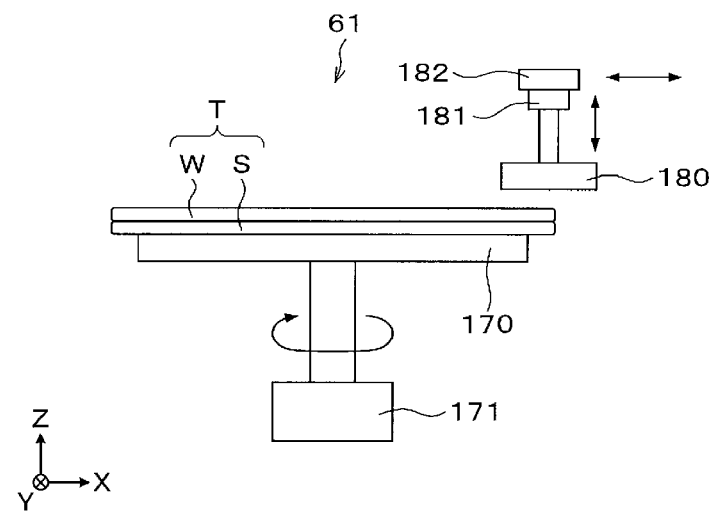
FIG. 11 is a side view illustrating a schematic configuration of the periphery removing apparatus.

Now, the aforementioned periphery removing apparatus 61 will be explained. FIG. 10 is a plan view illustrating a schematic configuration of the periphery removing apparatus 61. FIG. 11 is a side view illustrating the schematic configuration of the periphery removing apparatus 61.

The periphery removing apparatus 61 is equipped with a chuck 170 configured to hold the combined wafer T on a top surface thereof. The chuck 170 is configured to attract and hold the support wafer S in the state that the processing target wafer W is placed at an upper side and the support wafer S is placed at a lower side. Further, the chuck 170 is configured to be rotated around a vertical axis by a rotating mechanism 171.

Provided above the chuck 170 is a pad 180 configured to transfer the processing target wafer W while holding the peripheral portion We thereof. The pad 180 is connected with a suction mechanism (not shown) such as, but not limited to, a vacuum pump, and the pad 180 is configured to attract and hold the peripheral portion We on a bottom surface thereof. The pad 180 is equipped with an elevating mechanism 181 configured to move the pad 180 in a vertical direction and a moving mechanism 182 configured to move the pad 180 in horizontal directions (the X-axis direction and the Y-axis direction).

A detector 190 is provided above the chuck 170 to detect whether the peripheral portion We is removed from the processing target wafer W. The detector 190 detects presence or absence of the peripheral portion We in the processing target wafer W which is held by the chuck 170 and from which the peripheral portion We is removed. By way of example, a sensor may be used as the detector 190. The sensor may be, by way of non-limiting example, a line type laser displacement meter, and it detects the presence or absence of the peripheral portion We by radiating laser to the peripheral portion of the combined wafer T (processing target wafer W) and measuring a thickness of the combined wafer T. However, the way how to detect the presence or absence of the peripheral portion We by the detector 190 is not limited thereto. For example, the detector 190 may detect the presence or absence of the peripheral portion We by imaging the combined wafer T (processing target wafer W) with, for example, a line camera.

Further, a collector (not shown) configured to collect the peripheral portion We transferred by the pad 180 is provided under the chuck 170. The collector receives and collects the peripheral portion We attracted to and held by the pad 180.

Figure 12:
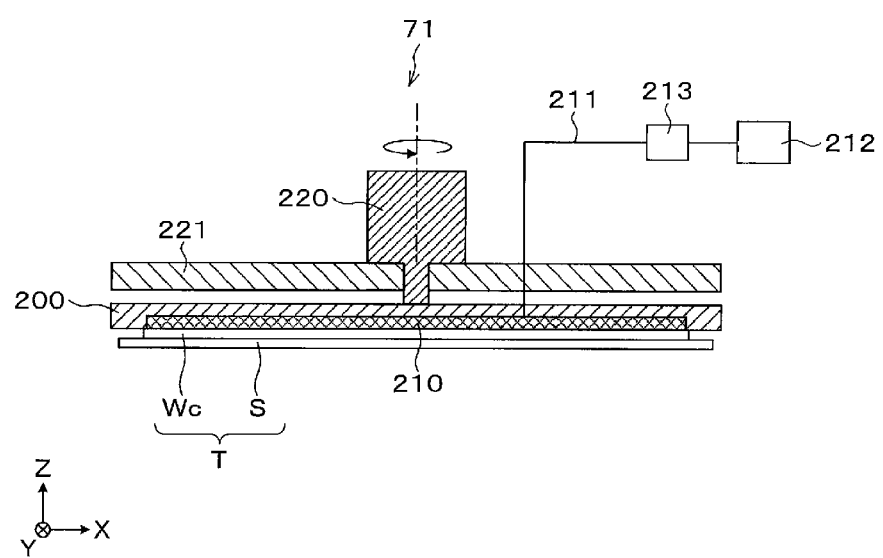
FIG. 12 is a longitudinal cross sectional view illustrating a schematic configuration of a transfer arm.

Now, the transfer arm 71 of the aforementioned wafer transfer device 70 will be described. FIG. 12 is a longitudinal cross sectional view illustrating a schematic configuration of the transfer arm 71.

The transfer arm 71 is equipped with a circular attraction plate 200 having a diameter larger than a diameter of the combined wafer T. A holder 210 configured to hold the central portion Wc of the processing target wafer W is provided in a bottom surface of the attraction plate 200.

A suction line 211 for suctioning the central portion Wc is connected to the holder 210, and the suction line 211 is connected to a suction mechanism 212 such as, but not limited to, a vacuum pump. The suction line 211 is provided with a pressure sensor 213 configured to measure a suction pressure. Though a configuration of the pressure sensor 213 is not particularly limited, a diaphragm pressure sensor may be used.

A rotating mechanism 220 configured to rotate the attraction plate 200 around a vertical axis is provided on a top surface of the attraction plate 200. The rotating mechanism 220 is supported at a supporting member 221. Further, the supporting member 221 (rotating mechanism 220) is supported at the arm member 72.

Figure 13:
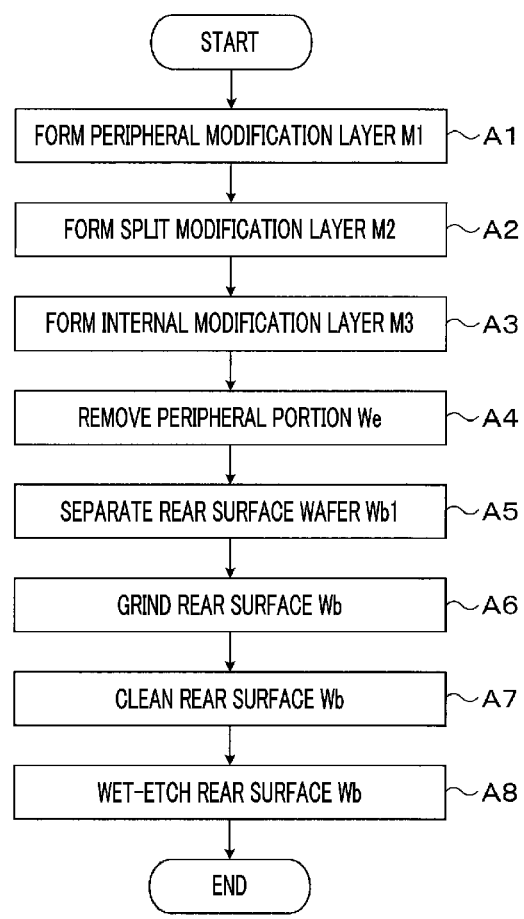
FIG. 13 is a flowchart illustrating main processes of a wafer processing.

Now, a wafer processing performed by using the wafer processing system 1 configured as described above will be discussed. FIG. 13 is a flowchart illustrating main processes of the wafer processing. FIG. 14A to FIG. 14F are explanatory diagrams illustrating the main processes of the wafer processing. In the present exemplary embodiment, the combined wafer T is previously formed by bonding the processing target wafer W and the support wafer S in the bonding apparatus (not shown) at the outside of the wafer processing system 1.

Figure 14A:
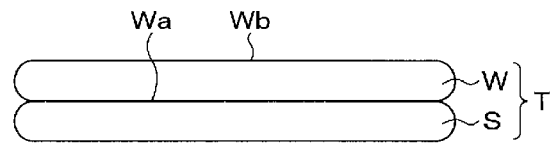
FIG. 14A to FIG. 14F are explanatory diagrams illustrating the main processes of the wafer processing.

First, the cassette Ct accommodating therein the multiple number of combined wafers T shown in FIG. 14A is placed on the cassette placing table 10 of the carry-in/out station 2.

Figure 14B:
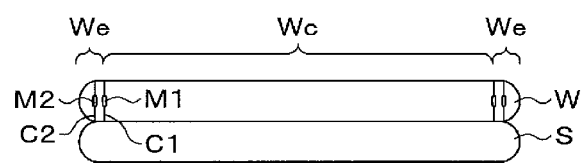
Figure 14C:
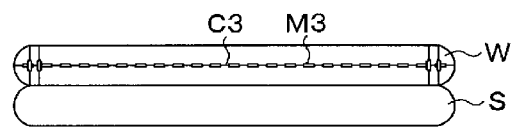

Then, the combined wafer T is taken out of the cassette Ct by the wafer transfer device 20, and transferred into the transition device 30. Subsequently, the combined wafer T is taken out of the transition device 30 by the wafer transfer device 50, and transferred into the modifying apparatus 60. In the modifying apparatus 60, a peripheral modification layer M1 and a split modification layer M2 are formed inside the processing target wafer W in sequence as illustrated in FIG. 14B (processes A1 and A2 of FIG. 13), and, also, an internal modification layer M3 is formed as illustrated in FIG. 14C (process A3 of FIG. 13). The peripheral modification layer M1 serves as a starting point when the peripheral portion We is removed in the edge trimming. The split modification layer M2 serves as starting point when the peripheral portion We to be removed is broken into smaller pieces. The internal modification layer M3 serves as a starting point for thinning the processing target wafer W.

FIG. 15A to FIG. 15E are explanatory diagrams illustrating main processes of a modifying processing performed by the modifying apparatus 60. First, as shown in FIG. 15A, the chuck 100 (slider table 102) is moved to a carry-in/out position P1. Then, the combined wafer T is carried in from the wafer transfer device 50 to be held by the chuck 100.

Then, the chuck 100 is moved to a macro-alignment position P2, as shown in FIG. 15B. The macro-alignment position P2 is a position where the macro-camera 140 is capable of imaging the outer end portion R1 of the processing target wafer W.

Thereafter, the outer end portion R1 of the processing target wafer W is imaged by the macro-camera 140 in 360 degrees in a circumferential direction of the processing target wafer W. The obtained image is outputted to the control device 90 from the macro-camera 140.

In the control device 90, the first eccentric amount between the center Cc of the chuck 100 and the center Cw of the processing target wafer W is calculated from the image obtained by the macro-camera 140. Further, in the control device 90, a moving amount of the chuck 100 is calculated based on the first eccentric amount to correct a Y-axis component of the first eccentric amount. The chuck 100 is moved in the Y-axis direction based on the calculated moving amount, and then moved to a micro-alignment position P3, as shown in FIG. 15C. The micro-alignment position P3 is a position where the micro-camera 150 is capable of imaging the peripheral portion of the processing target wafer W. Here, the field of view of the micro-camera 150 is smaller (about ⅕) than the field of view of the macro-camera 140, as stated above. Thus, if the Y-axis component of the first eccentric amount is not corrected, the peripheral portion of the processing target wafer W may not be included in an angle of view of the micro-camera 150, resulting in a failure to image the peripheral portion of the processing target wafer W with the micro-camera 150. For the reason, the correction of the Y-axis component based on the first eccentric amount is performed to move the chuck 100 to the micro-alignment position P3.

Subsequently, the boundary R2 between the bonding region Aa and the non-bonding region Ab is imaged by the micro-camera 150 in 360 degrees in the circumferential direction of the processing target wafer W. The obtained image is outputted to the control device 90 from the micro-camera 150.

In the control device 90, the second eccentric amount between the center Cc of the chuck 100 and the center Ca of the bonding region Aa is calculated from the image obtained by the micro-camera 150. Further, in the control device 90, the position of the chuck 100 with respect to the peripheral modification layer M1 is decided based on the second eccentric amount such that the center of the chuck 100 and the center of the bonding region Aa are coincident with each other. As stated above, though the non-bonding region Ab is formed before the processing target wafer W and the support wafer S are bonded, a center of this non-bonding region Ab (center Ca of the bonding region Aa) may be deviated from the center of the processing target wafer W. However, as in the present exemplary embodiment, by adjusting the position of the chuck 100 with respect to the peripheral modification layer M1 based on the second eccentric amount, the deviation of the non-bonding region Ab can be corrected.

Subsequently, the chuck 100 is moved to a modifying position P4, as shown in FIG. 15D. The modifying position P4 is a position where the laser head 110 radiates the laser light to the processing target wafer W to thereby form the peripheral modification layer M1. Further, in the present exemplary embodiment, the modifying position P4 is identical to the micro-alignment position P3.

Figure 16:
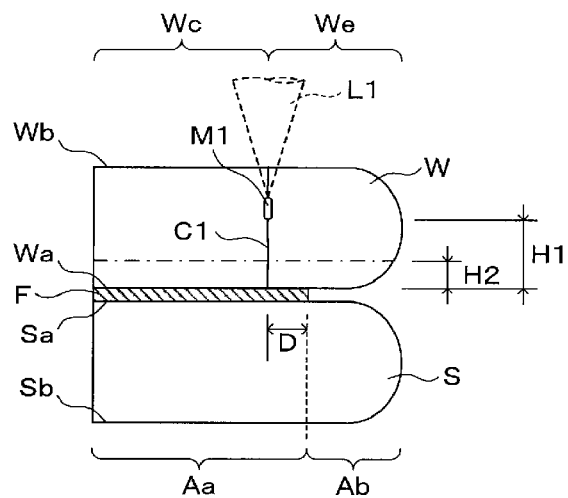
FIG. 16 is an explanatory diagram showing a state in which a peripheral modification layer is being formed in a processing target wafer.
Figure 17:
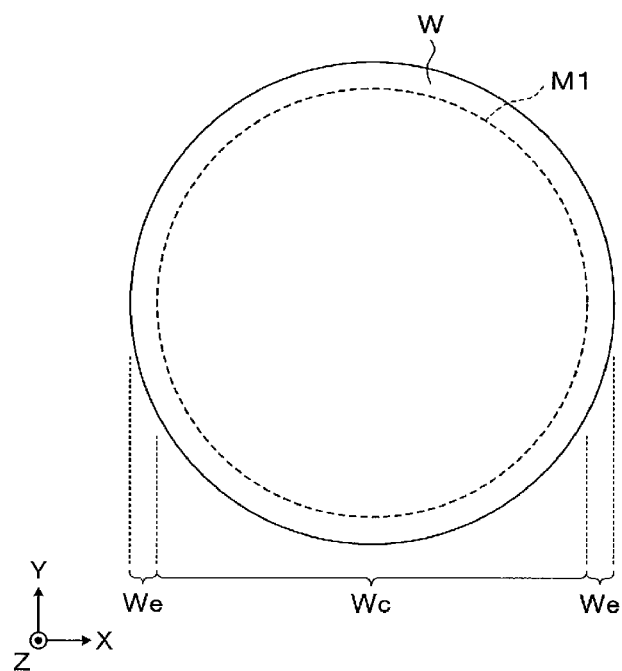
FIG. 17 is an explanatory diagram showing a state in which the peripheral modification layer is formed in the processing target wafer.

Thereafter, as illustrated in FIG. 16 and FIG. 17, by radiating laser light L1 (laser light L1 for periphery) from the laser head 110, the peripheral modification layer M1 is formed at the boundary between the peripheral portion We and the central portion Wc of the processing target wafer W (process A1 of FIG. 13). The shape and the number of the laser light L1 are adjusted by the LCOS. To elaborate, to form the peripheral modification layer M1 to be described later, the shape of the laser light L1 is adjusted as the focal point and the phase thereof are controlled. In the present exemplary embodiment, the number of the laser light L1 is one.

The peripheral modification layer M1 formed by the laser light L1 is elongated in a thickness direction and has an aspect ratio with a vertically longer side. A lower end of the peripheral modification layer M1 is located above a target surface (indicated by a dashed line in FIG. 16) of the processing target wafer W after being thinned. That is, a distance H1 between the lower end of the peripheral modification layer M1 and the front surface Wa of the processing target wafer W is larger than a target thickness H2 of the processing target wafer W after being thinned. In this case, the peripheral modification layer M1 does not remain in the processing target wafer W after being thinned. Further, within the processing target wafer W, a crack C1 develops from the peripheral modification layer M1, and reaches the front surface Wa and the rear surface Wb.

Further, the peripheral modification layer M1 is formed at an inner side than an outer end portion of the bonding region Aa in the diametrical direction. Even if the peripheral modification layer M1 is formed while being deviated from the outer end portion of the bonding region Aa due to, for example, a processing error or the like when the peripheral modification layer M1 is formed by the laser light L1 from the laser head 110, the peripheral modification layer M1 can be suppressed from being formed at an outer side than the outer end portion of the bonding region Aa in the diametrical direction. Here, if the peripheral modification layer M1 is formed at the outer side than the outer end portion of the bonding region Aa in the diametrical direction, the processing target wafer W may not be firmly bonded to the support wafer S after the peripheral portion We is removed. In the present exemplary embodiment, however, this state of the processing target wafer W can be securely suppressed.

Further, the present inventors have conducted researches and found out that the peripheral portion We can be appropriately removed if a distance D between the peripheral modification layer M1 and the outer end portion of the bonding region Aa is sufficiently small. This distance D is desirably within 500 µm and, more desirably, within 50 µm.

Here, in the control device 90, the position of the chuck 100 is decided based on the second eccentric amount. In the process A1, to locate the chuck 100 at the decided position, the chuck 100 is rotated by the rotator 103 and moved in the Y-axis direction by the horizontally moving member 104 such that the center of the chuck 100 and the center of the bonding region Aa are coincident. That is, the eccentricity correction is carried out in the process A1. At this time, the rotating of the chuck 100 and the moving of the chuck 100 in the Y-axis direction are synchronized. By performing the completely synchronized control as stated above, the chuck 100 can be moved to the decided position appropriately with little error.

While rotating and moving the chuck 100 (processing target wafer W) as described above, the laser light L1 is radiated to the inside of the processing target wafer W from the laser head 110. That is, while correcting the second eccentric amount, the peripheral modification layer M1 is formed. The peripheral modification layer M1 is formed in a ring shape to be concentric with the bonding region Aa. That is, the distance D between the peripheral modification layer M1 and the outer end portion of the bonding region Aa shown in FIG. 16 can be made constant. Thus, in the periphery removing apparatus 61, the peripheral portion We can be appropriately removed, starting from the peripheral modification layer M1.

Further, in the present exemplary embodiment, if the second eccentric amount includes an X-axis component, this X-axis component is corrected by rotating the chuck 100 while moving it in the Y-axis direction. Meanwhile, if the second eccentric amount does not include the X-axis component, the chuck 100 only needs to be moved in the Y-axis direction without being rotated.

Figure 18:
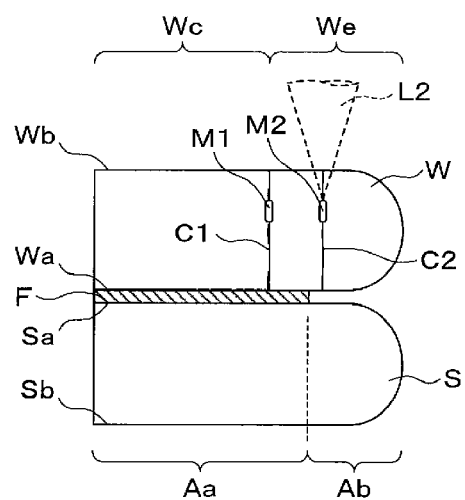
FIG. 18 is an explanatory diagram showing a state in which a split modification layer is being formed in the processing target wafer.
Figure 19:
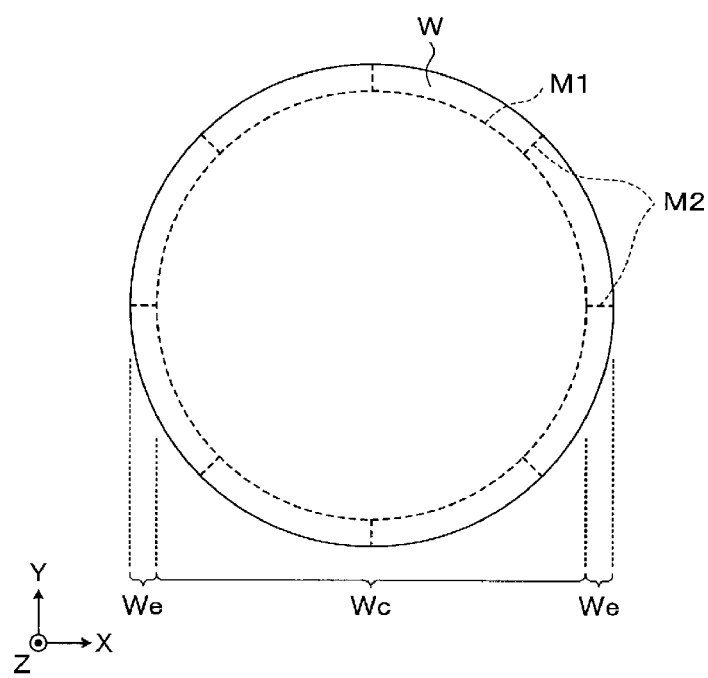
FIG. 19 is an explanatory diagram showing a state in which the split modification layer is formed in the processing target wafer.

Thereafter, the laser head 110 is moved in the Y-axis direction, and by radiating laser light L2 (laser light L2 for split) from the laser head 110, the split modification layer M2 is formed at an outer side than the peripheral modification layer M1 in the diametrical direction (process A2 of FIG. 13), as illustrated in FIG. 18 and FIG. 19. At this time, the laser light radiated from the laser head 110 is switched to the laser light L2 from the laser light L1 by the LCOS, and the shape and the number of the laser light L2 are adjusted. To be specific, as a focal position and a phase of the laser light L2 are adjusted, the shape of the laser light L2 is adjusted to form the split modification layer M2 to be described later. Further, in the present exemplary embodiment, the number of the laser light L2 is one.

The split modification layer M2 is elongated in the thickness direction and has an aspect ratio with a vertically longer side, the same as the peripheral modification layer M1. Further, in the present exemplary embodiment, the split modification layer M2 is formed on a level with the peripheral modification layer M1. In addition, a crack C2 develops from the split modification layer M2 and reaches the front surface Wa and the rear surface Wb.

Furthermore, by forming multiple split modification layers M2 and cracks C2 at a pitch of several micrometers (µm) in the diametrical direction, a single line-shaped split modification layer M2 elongated outwards from the peripheral modification layer M1 in the diametrical direction is formed, as shown in FIG. 19. Further, in the shown example, the line-shaped split modification layer M2 elongated in the diametrical direction is formed at eight different positions. However, the number of the split modification layers M2 is not particularly limited. As long as the split modification layers M2 are formed at two different positions at least, the peripheral portion We can be removed. In this case, when removing the peripheral portion We in the edge trimming, this peripheral portion We is separated starting from the ring-shaped peripheral modification layer M1 to be split into multiple pieces by the split modification layers M2. Accordingly, the peripheral portion We to be removed is broken into smaller pieces, and thus can be removed more easily.

Moreover, though the laser head 110 is moved in the Y-axis direction to form the split modification layer M2 in the present exemplary embodiment, the chuck 100 may be moved in the Y-axis direction instead.

Figure 20:
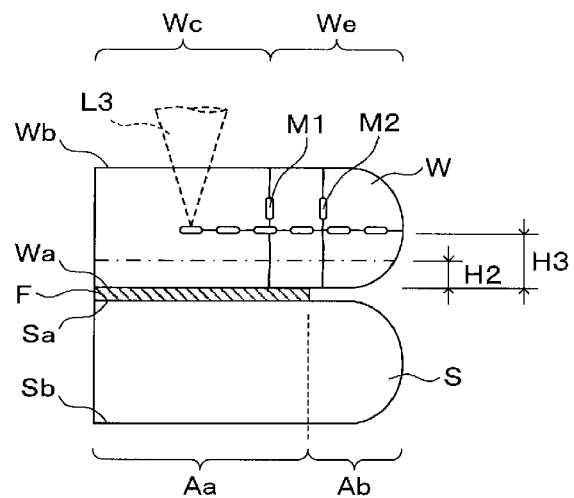
FIG. 20 is an explanatory diagram showing a state in which an internal modification layer is being formed in the processing target wafer.
Figure 21:
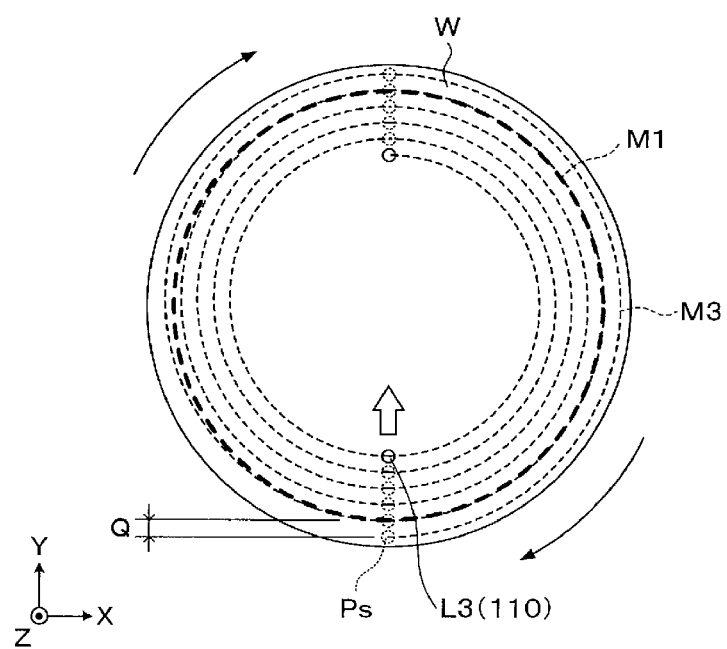
FIG. 21 is an explanatory diagram showing a state in which the internal modification layer is formed in the processing target wafer.

Subsequently, as depicted in FIG. 20 and FIG. 21, by radiating laser light L3 (laser light L3 for internal surface) from the laser head 110, the internal modification layer M3 is formed along a plane direction of the processing target wafer W (process A3 of FIG. 13). At this time, the laser light radiated from the laser head 110 is switched to the laser light L3 from the laser light L2 by the LCOS, and the shape and the number of the laser light L3 are adjusted. To be specific, as a focal position and a phase of the laser light L3 are adjusted, the shape of the laser light L3 is adjusted to form the internal modification layer M3 to be described later. Further, in the present exemplary embodiment, the number of the laser light L3 is one. In addition, black arrows shown in FIG. 21 indicate a rotation direction of the chuck 100, the same as in the following description.

A lower end of the internal modification layer M3 is located above the target surface (indicated by a dashed line in FIG. 20) of the processing target wafer W after being thinned. That is, a distance H3 between the lower end of the internal modification layer M3 and the front surface Wa of the processing target wafer W is slightly larger than the target thickness H2 of the processing target wafer W after being thinned. Within the processing target wafer W, a crack C3 develops from the internal modification layer M3 along the plane direction.

In the process A3, while rotating the chuck 100 (processing target wafer W) and moving the laser head 110 in the Y-axis direction from the peripheral portion of the processing target wafer W toward the central portion thereof, the laser light L3 is radiated from the laser head 110 to the inside of the processing target wafer W. As a result, the internal modification layer M3 is formed in a spiral shape from an outer side to an inner side within the surface of the processing target wafer W.

Further, in the present exemplary embodiment, though the laser head 110 is moved in the Y-axis direction to form the internal modification layer M3, the chuck 100 may be moved in the Y-axis direction instead.

Here, though the eccentricity correction is performed when forming the peripheral modification layer M1 in the process A1 as stated above, the eccentricity correction is not performed when forming the internal modification layer M3 in the process A3.

When separating the processing target wafer W starting from the internal modification layer M3 as will be described later, an interval (pitch) of the internal modification layers M3 is set to be uniform to perform this separation uniformly within the surface of the processing target wafer W. For the purpose, in the process A3, the interval of the internal modification layer M3 is adjusted by controlling the rotation speed of the chuck 100. That is, when the position of the laser head 110 in the diametrical direction (that is, a radiation position of the laser light L3) is located at the peripheral portion, the rotation speed is slowed down, whereas when the position of the laser head 110 in the diametrical direction is located at the central portion, the rotation speed is increased. To elaborate, when the processing target wafer W has a diameter of, e.g., 300 mm, the rotation speed is set to be in a range from 30 rpm to 60 rpm at the peripheral portion (for example, within a range from 120 mm to 150 mm in the diametrical direction) of the processing target wafer W. Meanwhile, the rotation speed is set to be in a range from 500 rpm to 3000 rpm at the central portion (for example, within a range from 0 mm (center point) to 20 mm in the diametrical direction) of the processing target wafer W. Further, in a range from 20 mm to 120 mm in the diametrical direction of the processing target wafer W, the rotation speed varies linearly within a range from 60 rpm to 500 rpm.

In this case, particularly, when the laser head 110 is located at the central portion, it is difficult to accord the moving of the chuck 100 to the eccentricity correction as the chuck 100 is rotated at a high speed. Thus, when the laser head 110 is located at the central portion, the laser light L3 is radiated from the laser head 110 without performing the eccentricity correction.

Further, in the present exemplary embodiment, when the laser head 110 is located at the peripheral portion, the laser light L3 is radiated from the laser head 110 without performing the eccentricity correction as well. Here, however, a radiation start position Ps of the laser light L3 from the laser head 110 is set to an outer side than the peripheral modification layer M1 in the diametrical direction. A distance Q between the radiation start position Ps and the peripheral modification layer M1 in the diametrical direction is equal to or larger than the second eccentric amount. By setting the radiation start position Ps of the laser light L3 as stated above, the eccentricity (second eccentric amount) between the center Cc of the chuck 100 and the center Ca of the bonding region Aa is absorbed, so that the internal modification layer M3 can be appropriately formed within the entire surface of the processing target wafer W. Accordingly, the processing target wafer W can be appropriately separated starting from the internal modification layer M3.

In the present exemplary embodiment, the laser light L3 is radiated approximately one round at the outer side than the peripheral modification layer M1 in the diametrical direction to thereby form the internal modification layer M3. However, as long as the radiation start position Ps of the laser light L3 is located at the outer side than the peripheral modification layer M1 in the diametrical direction, the internal modification layer M3 may be formed equal to or less than one round at the outer side than the peripheral modification layer M1.

Subsequently, once the internal modification layer M3 is formed within the processing target wafer W, the chuck 100 is moved to the carry-in/out position P1, as shown in FIG. 15E. Then, the combined wafer T is taken out by the wafer transfer device 70.

Figure 14D:
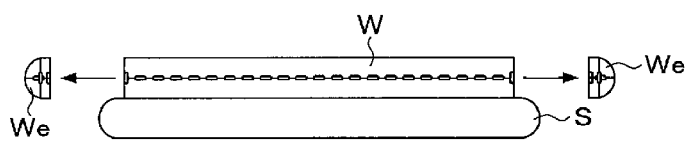
Figure 22:
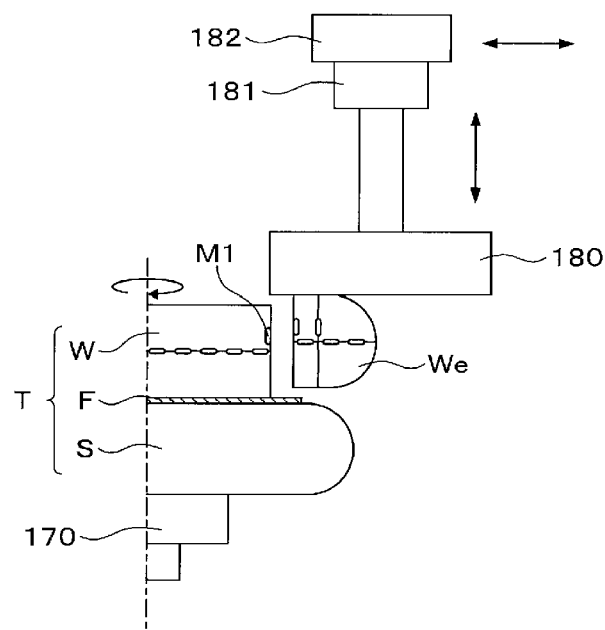
FIG. 22 is an explanatory diagram showing a state in which a peripheral portion is being removed.

Then, the combined wafer T is transferred into the periphery removing apparatus 61 by the wafer transfer device 70. In the periphery removing apparatus 61, the peripheral portion We of the processing target wafer W is removed starting from the peripheral modification layer M1 (process A4 of FIG. 13), as illustrated in FIG. 14D. In the process A4, as illustrated in FIG. 22, the pad 180 is lowered by the elevating mechanism 181 to attract and hold the peripheral portion We, and, then, the pad 180 is raised. As a result, the peripheral portion We held by the pad 180 is separated from the processing target wafer W, starting from the peripheral modification layer M1. At this time, the peripheral portion We is separated while being broken into smaller pieces starting from the split modification layers M2. Further, the removed peripheral portion We is collected from the pad 180 into the collector (not shown).

Figure 14E:
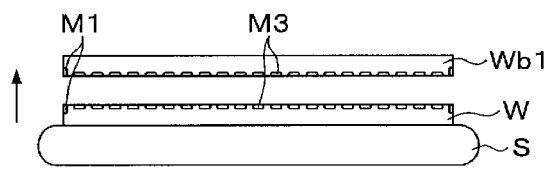

Thereafter, the combined wafer T is transferred into the processing apparatus 80 by the wafer transfer device 70. First, in the processing apparatus 80, when the combined wafer T is delivered from the transfer ram 71 onto the chuck 81, the rear surface Wb side of the processing target wafer W (hereinafter, referred to as "rear surface wafer Wb1") is separated starting from the internal modification layer M3 (process A5 of FIG. 13), as illustrated in FIG. 14E.

Figure 23A:
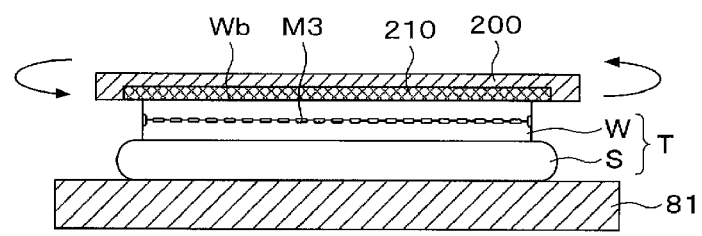
FIG. 23A and FIG. 23B are explanatory diagrams showing a state in which a rear surface wafer is being separated from the processing target wafer.
Figure 23B:
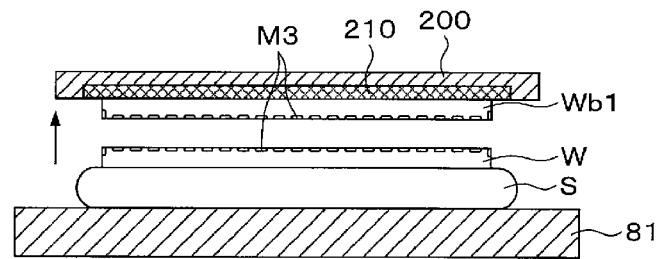

In the process A5, the support wafer S is attracted to and held by the chuck 81 while the processing target wafer W is attracted to and held by the attraction plate 200 of the transfer arm 71, as shown in FIG. 23A. Then, the attraction plate 200 is rotated, and the rear surface wafer Wb1 is cut along the internal modification layer M3. Thereafter, as shown in FIG. 23B, the attraction plate 200 is raised in the state that the rear surface wafer Wb1 is attracted to and held by the attraction plate 200, so that the rear surface wafer Wb1 is separated from the processing target wafer W. At this time, by measuring a pressure for suctioning the rear surface wafer Wb1 with the pressure sensor 213, presence or absence of the rear surface wafer Wb1 is detected. Thus, it can be checked whether the rear surface wafer Wb1 is separated from the processing target wafer W. Further, if the rear surface wafer Wb1 can be separated only by raising the attraction plate 200 as shown in FIG. 23B, the rotating of the attraction plate 200 shown in FIG. 23A can be omitted. Further, the separated rear surface wafer Wb1 is collected to the outside of the wafer processing system 1.

Figure 14F:
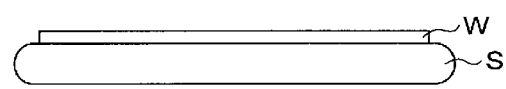

Subsequently, as shown in FIG. 14F, the rear surface Wb of the processing target wafer W held by the chuck 81 is ground, and the internal modification layer M3 and the peripheral modification layer M1 left on the rear surface Wb are removed (process A6 of FIG. 13). In the process A6, by rotating the processing target wafer W and the grinding whetstone in the state that the rear surface Wb is in contact with the grinding whetstone, the rear surface Wb is ground. Further, the rear surface Wb of the processing target wafer W may be then cleaned by a cleaning liquid from a cleaning liquid nozzle (not shown).

Thereafter, the combined wafer T is transferred to the cleaning apparatus 41 by the wafer transfer device 70. In the cleaning apparatus 41, the ground rear surface Wb of the processing target wafer W is scrub-cleaned (process A7 of FIG. 13). Further, in the cleaning apparatus 41, the rear surface Sb of the support wafer S as well as the rear surface Wb of the processing target wafer W may be cleaned.

Afterwards, the combined wafer T is transferred to the etching apparatus 40 by the wafer transfer device 50. In the etching apparatus 40, the rear surface Wb of the processing target wafer W is wet-etched by the chemical liquid (process A8 of FIG. 13). A grinding mark may be formed on the rear surface Wb ground by the aforementioned processing apparatus 80. In the process A8, the grinding mark can be removed by performing the wet-etching, so that the rear surface Wb can be flattened.

Then, the combined wafer T after being subjected to all the required processings is transferred to the transition device 30 by the wafer transfer device 50, and then transferred into the cassette Ct on the cassette placing table 10 by the wafer transfer device 20. Accordingly, a series of the processes of the wafer processing in the wafer processing system 1 is ended.

According to the above-described exemplary embodiment, the edge trimming is performed by removing the peripheral portion We starting from the peripheral modification layer M1, and the thinning of the processing target wafer W is performed by separating the rear surface wafer Wb1 starting from the internal modification layer M3. Since the laser head 110 used to form the peripheral modification layer M1 and the internal modification layer M3 is not degraded with a lapse of time, less consumables are used. Therefore, a frequency of maintenance can be reduced. Furthermore, since these processings are dry-processes using the laser, the disposal of the grinding water and the waste water is not required. Therefore, the running cost can be reduced. Thus, as compared to the conventional edge trimming by grinding and the conventional thinning by grinding, the running cost can be reduced.

Furthermore, in the present exemplary embodiment, although the rear surface Wb is ground in the process A6, this grinding needs to be performed just to remove the internal modification layer M3 and the peripheral modification layer M1, and the grinding amount thereof is small (about several tens of micrometers). In contrast, in case of grinding the rear surface Wb to thin the processing target wafer W as in the prior art, the grinding amount thereof is large (e.g., 700 μm), and the grinding whetstone is abraded greatly. Thus, in the present exemplary embodiment, the frequency of the maintenance can be further reduced.

In addition, according to the present exemplary embodiment, the peripheral modification layer M1, the split modification layer M2 and the internal modification layer M3 can be formed by adjusting the shapes of the laser lights L1 to L3 by using the single laser head 110. That is, even when directions in which the modification layers are elongated are different or even when required processing qualities are different, the appropriate shape of the laser light can be selected by using the single laser head 110. Since a modification layer having any required shape can be formed, the degree of freedom in forming the modification layer can be improved. Further, since a footprint of the apparatus can be reduced, space can be saved. Furthermore, since the apparatus configuration is simplified, an apparatus cost can be cut. As stated above, in the present exemplary embodiment, the pre-treatment of the thinning and the edge trimming of the processing target wafer W can be performed efficiently.

Moreover, in the present exemplary embodiment, when forming the peripheral modification layer M1 in the process A1, the eccentricity correction is performed to allow the center of the chuck 100 and the center of the bonding region Aa to coincide with each other. Accordingly, the peripheral modification layer M1 can be formed at the appropriate position to be concentric with the bonding region Aa. Thus, the peripheral portion We can be appropriately removed in the following process A4.

Further, in the present exemplary embodiment, when forming the internal modification layer M3 in the process A3, the eccentricity correction is not performed, and the radiation start position Ps of the laser light L3 is set to be located at the outer side than the peripheral modification layer M1 in the diametrical direction. In this case, the internal modification layer M3 can be formed appropriately within the entire surface of the processing target wafer W. Besides, in the process A3, even if the laser head 110 is located at the central portion, the eccentricity correction is not performed, and the high-speed rotation can be maintained. As a result, the interval of the internal modification layer M3 can be set to be uniform in the plane direction. Thus, the processing target wafer W can be separated appropriately in the following process A5.

According to the present exemplary embodiment as described above, by performing or not performing the eccentricity correction, the formation of the peripheral modification layer M1 in the process A1 and the formation of the internal modification layer M3 in the process A3 can be carried out appropriately.

In the above-described exemplary embodiment, the eccentricity correction is not performed in the process A3, and the radiation start position Ps of the laser light L3 is set to be located at the outer side than the peripheral modification layer M1 in the diametrical direction. Accordingly, the second eccentric amount is absorbed, and the internal modification layer M3 can be formed appropriately within the processing target wafer W. Here, however, the way how to form the internal modification layer M3 in consideration of the second eccentric amount is not limited to the above-described example.

Figure 24:
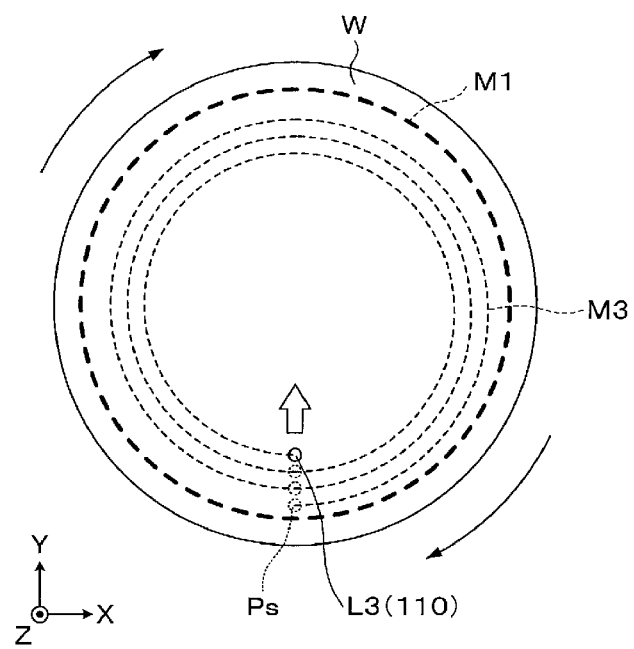
FIG. 24 is an explanatory diagram showing a state in which an internal modification layer is being formed in a processing target wafer in another exemplary embodiment.

By way of example, as shown in FIG. 24, the radiation start position Ps of the laser light L3 from the laser head 110 is set to be located at an inner side than the peripheral modification layer M1 in the diametrical direction. In a range where the laser head 110 is located at the peripheral portion of the processing target wafer W, the eccentricity correction is performed. That is, while moving the laser head 110 from the outer side toward the inner side in the diametrical direction, the chuck 100 is rotated by the rotator 103 such that the center of the chuck 100 and the center of the bonding region Aa are coincident with each other, and, also, the chuck 100 is moved in the Y-axis direction by the horizontally moving member 104. At this time, since the rotation speed of the chuck 100 is slow, the eccentricity correction can be carried out appropriately. As a result, the second eccentric amount can be absorbed, and the internal modification layer M3 can be formed inside the peripheral modification layer M1. The eccentricity correction in this exemplary embodiment may be performed only for a time during which the laser head 110 radiates the laser light L3 in several rounds from the outer side.

Then, if the laser head 110 reaches the central portion of the processing target wafer W, the rotation speed of the chuck 100 is increased. Thus, as in the above-described exemplary embodiment, the eccentricity correction is not performed in the range where the laser head 110 is located at the central portion. As a result, the high rotation speed can be maintained, and the interval of the internal modification layer M3 can be uniformed in the plane direction.

As described above, in the present exemplary embodiment, the same effects as mentioned in the above-described exemplary embodiment can be obtained, and the internal modification layer M3 can be appropriately formed within the processing target wafer W.

Furthermore, in the above-described exemplary embodiments, though the laser lights L1 to L3 having the different shapes are radiated by the single laser head 110, it is desirable that the laser head 110 is corrected (calibrated) before the combined wafer T as a processing target is carried into the modifying apparatus 60. To be more specific, it is desirable to correct the laser head 110 before the combined wafer T is held on the chuck 100. In this case, since the correction upon the laser head 110 need not be performed during the modifying processing upon the single processing target wafer W, a time required for the switching of the laser lights L1 to L3 can be saved. As a result, a throughput of the wafer processing can be improved.

Moreover, in the above-described exemplary embodiments, although the single laser light L1 is radiated to the inside of the processing target wafer W from the laser head 110 to form the peripheral modification layer M1, multiple laser lights L1 may be radiated. In this case, a time taken to form the peripheral modification layer M1 can be shortened, so that the throughput of the wafer processing can be further improved. Likewise, although the single laser light L3 is radiated to the inside of the processing target wafer W from the laser head 110 to form the internal modification layer M3, multiple laser lights L3 may be radiated. In this case, a time taken to form the internal modification layer M3 can be shortened, so that the throughput of the wafer processing can be further improved.

Figure 25:
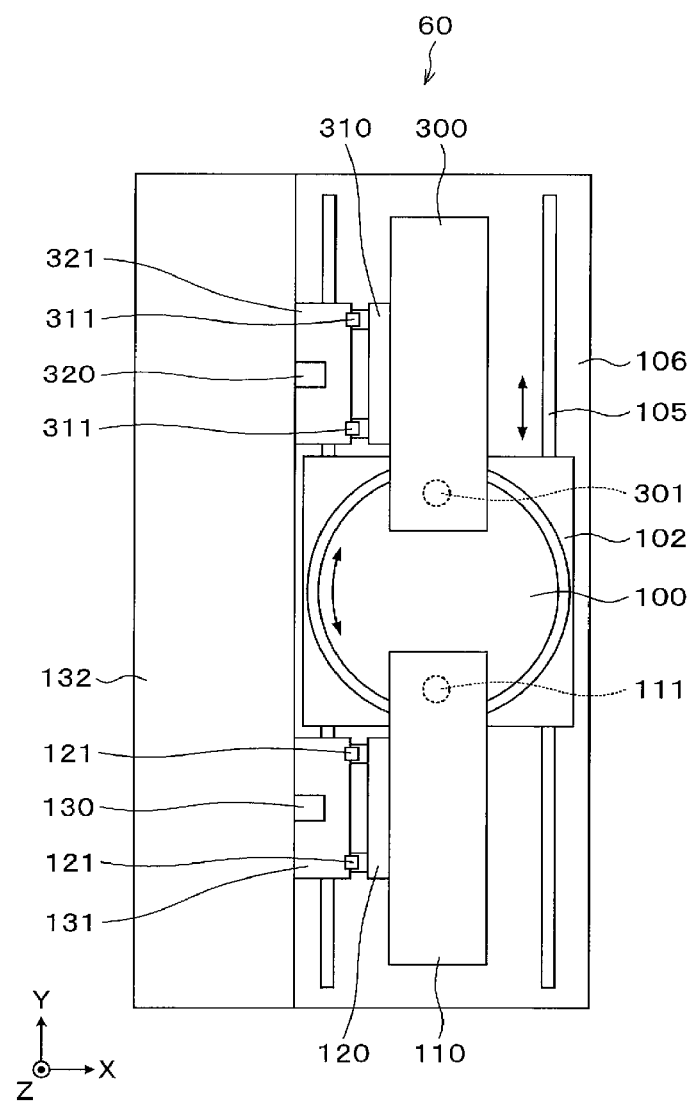
FIG. 25 is a plan view illustrating a schematic configuration of a modifying apparatus according to another exemplary embodiment.

Although the modifying apparatus 60 according to the above-described exemplary embodiments is equipped with the single laser head 110, a plurality of, for example, two laser heads 110 and 300 may be provided, as illustrated in FIG. 25. In the present exemplary embodiment, for the convenience of explanation, the laser head 110 is referred to as a first laser head 110, and the laser head 300 is referred to as a second laser head 300. The number of the laser heads is not limited to the example of the present exemplary embodiment. Further, in FIG. 25, illustration of the macro-camera 140 and the micro-camera 150 is omitted for the simplicity of illustration.

The second laser head 300 is provided at the positive Y-axis side of the first laser head 110. The second laser head 300 has the same configuration as that of the first laser head 110. That is, the second laser head 300 has a lens 301 and a LCOS (not shown).

A supporting configuration of the second laser head 300 is the same as the supporting configuration of the first laser head 110. That is, the second laser head 300 is supported at a supporting member 310, a rail 311, an elevating mechanism 320 and a moving mechanism 321. The second laser head 300 is configured to be movable up and down and, also, movable in the Y-axis direction.

Figure 26:
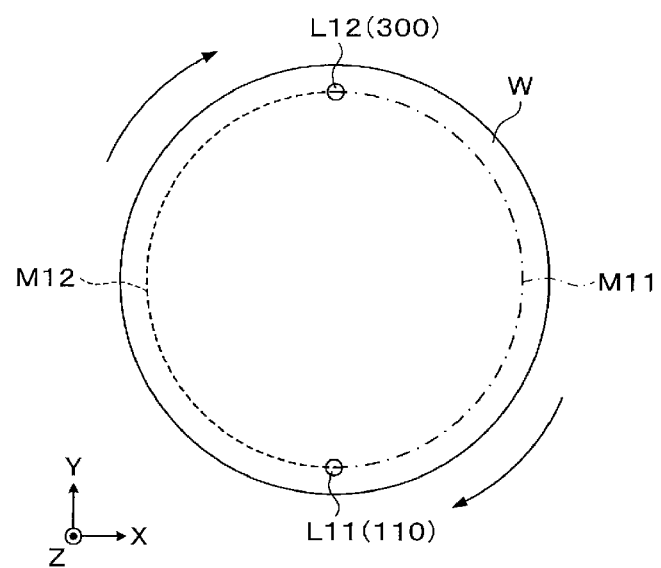
FIG. 26 is an explanatory diagram showing a state in which a peripheral modification layer is being formed in a processing target wafer in the another exemplary embodiment.

In this configuration, when forming the peripheral modification layer M1, the first laser head 110 and the second laser head 300 are arranged on the same circle at the peripheral portion of the processing target wafer W, as illustrated in FIG. 26. Then, while rotating the processing target wafer W, laser light L11 is radiated from the first laser head 110, and laser light L12 is radiated from the second laser head 300. As a result, a peripheral modification layer M11 is formed by the laser light L11, and a peripheral modification layer M12 is formed by the laser light L12. Each of the peripheral modification layers M11 and M12 is formed in a half round on the processing target wafer W, and these peripheral modification layers M11 and M12 form the peripheral modification layer M1 of a ring shape together. That is, in the present exemplary embodiment, the processing target wafer W only needs to be rotated by 180 degrees when forming the peripheral modification layer M1. In this case, the time taken to form the peripheral modification layer M1 can be shortened, so that the throughput of the wafer processing can be further improved.

Further, in the above-described exemplary embodiment, the laser light L11 from the first laser head 110 and the laser light L12 from the second laser head 300 are radiated to the same depth within the processing target wafer W, so the peripheral modification layer M11 and the peripheral modification layer M12 are formed at the same depth. However, by radiating the laser light L11 and the laser light L12 to different depths, the peripheral modification layer M11 and the peripheral modification layer M12 may be formed at the different depths.

Figure 27:
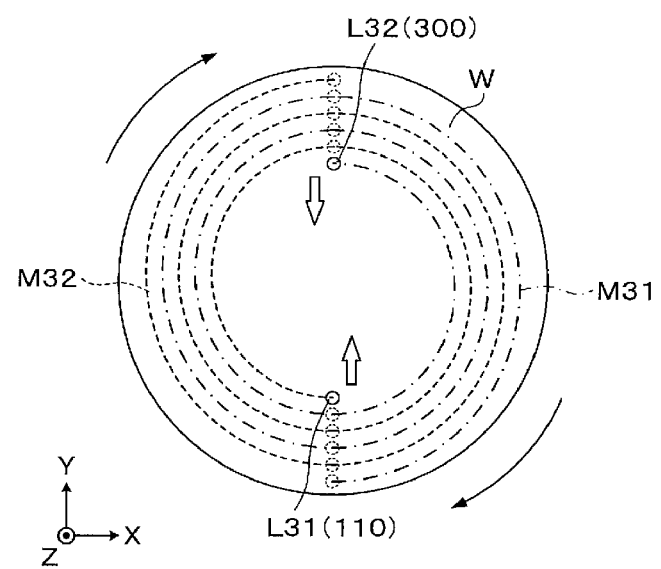
FIG. 27 is an explanatory diagram showing a state in which an internal modification layer is being formed in a processing target wafer in the another exemplary embodiment.

Moreover, when forming the internal modification layer M3, the first laser head 110 and the second laser head 300 are arranged on the same circle at the peripheral portion of the processing target wafer W, as shown in FIG. 27. Then, while rotating the processing target wafer W, the first laser head 110 and the second laser head 300 are respectively moved in the Y-axis directions from the peripheral portion of the processing target wafer W toward the central portion thereof. That is, the first laser head 110 is moved in the positive Y-axis direction, whereas the second laser head 300 is moved in the negative Y-axis direction. During the rotating of the processing target wafer W and the moving of the laser heads 110 and 300, laser light L31 is radiated to the inside of the processing target wafer W from the first laser head 110, and laser light L32 is radiated to the inside of the processing target wafer W from the second laser head 300. As a result, an internal modification layer M31 is formed by the laser light L31, and an internal modification layer M32 is formed by the laser light L32. Each of the internal modification layers M31 and M32 is formed in a spiral shape, so that the internal modification layer M3 is formed within the entire surface of the processing target wafer W. Since the internal modification layers M31 and M32 are formed at the same time as stated above, the time taken to form the internal modification layer M3 can be shortened, so that the throughput of the wafer processing can be further improved.

In the above-described exemplary embodiments, the split modification layer M2 is formed in the modifying apparatus 60 by using the laser head 110 which is used to form the peripheral modification layer M1 and the internal modification layer M3. However, another laser head (not shown) may be used. Further, in the modifying apparatus 60, the peripheral modification layer M1, the split modification layer M2 and the internal modification layer M3 may be formed by using all different laser heads (not shown).

In the above-described exemplary embodiments, the peripheral portion We is removed in the state that this peripheral portion We is held by the pad 180 in the periphery removing apparatus 61. However, the way how to remove the peripheral portion We may not be limited thereto. By way of example, the peripheral portion We may be removed by applying a physical impact, an ultrasonic wave, or the like to the peripheral portion We.

Additionally, in the above-described exemplary embodiments, although the separation of the rear surface wafer Wb1 from the processing target wafer W is performed when the combined wafer T is delivered to the chuck 81 of the processing apparatus 80 from the transfer arm 71 of the wafer transfer device 70, the way how to separate the rear surface wafer Wb1 is not limited thereto. By way of example, a separating device (not shown) may be provided in the same apparatus where the periphery removing apparatus 61 is provided, or this separating device (not shown) may be provided separately.

It should be noted that the exemplary embodiment is illustrative in all aspects and is not anyway limiting. The above-described exemplary embodiment may be omitted, replaced and modified in various ways without departing from the scope and the spirit of claims.

According to the exemplary embodiments, it is possible to efficiently perform, in the combined substrate in which the substrates are bonded to each other, the pre-treatments for removing of the peripheral portion of the single substrate and thinning of this single substrate.

We claim:

1. A substrate processing apparatus configured to process a substrate, comprising:
    a holder configured to hold, in a combined substrate in which a first substrate and a second substrate are bonded to each other, the second substrate;
    a detector configured to detect a boundary between a bonding region where the first substrate and the second substrate are bonded and a non-bonding region located at an outside of the bonding region;
    a peripheral modifying device configured to form a peripheral modification layer by radiating laser light for periphery to an inside of the first substrate held by the holder along a boundary between a peripheral portion of the first substrate as a removing target and a central portion thereof;
    an internal modifying device configured to form an internal modification layer by radiating laser light for internal surface to the inside of the first substrate held by the holder along a plane direction of the first substrate;
    a holder moving mechanism configured to move the holder in a horizontal direction; and
    a controller configured to calculate an eccentric amount between a center of the holder and a center of the bonding region from a detection result obtained by the detector, and perform eccentricity correction of moving the holder by controlling the holder moving mechanism such that the center of the holder and the center of the bonding region are coincident with each other based on the eccentric amount,
    wherein the peripheral modifying device radiates the laser light for periphery to the inside of the first substrate while moving the holder to perform the eccentricity correction, and
    the internal modifying device radiates the laser light for internal surface without performing the eccentricity correction at least at a center portion of the inside of the first substrate.

2. The substrate processing apparatus of claim 1,
    wherein a radiation start position of the laser light for internal surface by the internal modifying device is located at an outer side than the peripheral modification layer in a diametrical direction thereof, and
    the internal modifying device radiates the laser light for internal surface from the radiation start position toward an inner side in the diametrical direction without performing the eccentricity correction.

3. The substrate processing apparatus of claim 2,
    wherein the radiation start position is a position outwardly distanced apart from the peripheral modification layer in the diametrical direction by equal to or larger than the eccentric amount.

4. The substrate processing apparatus of claim 1,
    wherein a radiation start position of the laser light for internal surface by the internal modifying device is located at an inner side than the peripheral modification layer in a diametrical direction,
    the internal modifying device radiates, at an outer circumferential portion of the inside of the first substrate, the laser light for internal surface from the radiation start position toward an inner side in the diametrical direction while moving the holder by performing the eccentricity correction, and the internal modifying device then radiates, at the center portion of the inside of the first substrate, the laser light for internal surface without performing the eccentricity correction.

5. The substrate processing apparatus of claim 1, wherein the peripheral modifying device and the internal modifying device share a laser head, and
the laser head switches the laser light for periphery and the laser light for internal surface.

6. The substrate processing apparatus of claim 5, wherein the laser head includes multiple laser heads.

7. The substrate processing apparatus of claim 5, wherein the laser head is configured to be moved up and down in a vertical direction and, also, moved in the horizontal direction.

8. A substrate processing method of processing a substrate, comprising:
holding, in a combined substrate in which a first substrate and a second substrate are bonded to each other, the second substrate with a holder;
detecting a boundary between a bonding region where the first substrate and the second substrate are bonded and a non-bonding region located at an outside of the bonding region;
calculating an eccentric amount between a center of the holder and a center of the bonding region from a detection result of the detecting of the boundary between the bonding region and the non-bonding region;
performing, based on the eccentric amount, eccentricity correction of moving the holder such that the center of the holder and the center of the bonding region are coincident with each other;
forming a peripheral modification layer by radiating laser light for periphery from a peripheral modifying device to an inside of the first substrate held by the holder along a boundary between a peripheral portion of the first substrate as a removing target and a central portion thereof; and
forming an internal modification layer by radiating laser light for internal surface from an internal modifying device to the inside of the first substrate held by the holder along a plane direction of the first substrate,
wherein the peripheral modifying device radiates the laser light for periphery to the inside of the first substrate while moving the holder to perform the eccentricity correction, and
the internal modifying device radiates the laser light for internal surface without performing the eccentricity correction at least at a center portion of the inside of the first substrate.

9. The substrate processing method of claim 8,
wherein a radiation start position of the laser light for internal surface by the internal modifying device is located at an outer side than the peripheral modification layer in a diametrical direction thereof, and
the internal modifying device radiates the laser light for internal surface from the radiation start position toward an inner side in the diametrical direction without performing the eccentricity correction.

10. The substrate processing method of claim 9,
wherein the radiation start position is a position outwardly distanced apart from the peripheral modification layer in the diametrical direction by equal to or larger than the eccentric amount.

11. The substrate processing method of claim 8,
wherein a radiation start position of the laser light for internal surface by the internal modifying device is located at an inner side than the peripheral modification layer in a diametrical direction,
the internal modifying device radiates, at an outer circumferential portion of the inside of the first substrate, the laser light for internal surface from the radiation start position toward an inner side in the diametrical direction while moving the holder by performing the eccentricity correction, and
the internal modifying device then radiates, at the center portion of the inside of the first substrate, the laser light for internal surface without performing the eccentricity correction.

12. The substrate processing method of claim 8,
wherein the peripheral modifying device and the internal modifying device share a laser head, and
the laser head switches the laser light for periphery and the laser light for internal surface.

13. The substrate processing method of claim 12,
wherein the laser head includes multiple laser heads, and
when the peripheral modification layer is formed, the multiple laser heads radiate the laser light for periphery to the inside of the first substrate at a same time.

14. The substrate processing method of claim 12,
wherein the laser head includes multiple laser heads, and
when the internal modification layer is formed, the multiple laser heads radiate the laser light for internal surface to the inside of the first substrate at a same time.

* * * * *